(12) United States Patent
Chu et al.

(10) Patent No.: US 12,125,934 B2
(45) Date of Patent: Oct. 22, 2024

(54) METHOD OF MANUFACTURING AN OPTICAL SENSOR

(71) Applicant: TAIWAN SEMICONDUCTOR MANUFACTURING COMPANY LTD., Hsinchu (TW)

(72) Inventors: Yi-Shin Chu, Hsinchu (TW); Hsiang-Lin Chen, Hsinchu (TW); Yin-Kai Liao, Taipei (TW); Sin-Yi Jiang, Hsinchu (TW); Kuan-Chieh Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 551 days.

(21) Appl. No.: 17/213,961

(22) Filed: Mar. 26, 2021

(65) Prior Publication Data
US 2022/0310871 A1    Sep. 29, 2022

(51) Int. Cl.
*H01L 31/18*    (2006.01)
*H01L 31/02*    (2006.01)

(52) U.S. Cl.
CPC .... *H01L 31/1812* (2013.01); *H01L 31/02016* (2013.01); *H01L 31/1864* (2013.01); *H01L 31/1868* (2013.01)

(58) Field of Classification Search
CPC .................. H01L 31/02016; H01L 31/1864
See application file for complete search history.

(56) References Cited

U.S. PATENT DOCUMENTS

| | | | | |
|---|---|---|---|---|
| 2009/0243019 A1* | 10/2009 | Kawai | .................. | H01L 31/028 257/E31.032 |
| 2011/0163406 A1* | 7/2011 | Miura | .................. | H01L 31/105 257/E31.06 |
| 2014/0339614 A1* | 11/2014 | Fang | ................. | H01L 27/14603 257/292 |

* cited by examiner

*Primary Examiner* — Jay C Chang
*Assistant Examiner* — Mikka Liu
(74) *Attorney, Agent, or Firm* — WPAT LAW; Anthony King

(57) ABSTRACT

A method of manufacturing a semiconductor structure includes: forming a light-absorption layer in a substrate; forming a first doped region of a first conductivity type and a second doped region of a second conductivity type in the light-absorption layer adjacent to the first doped region; depositing a first patterned mask layer over the light-absorption layer, wherein the first patterned mask layer includes an opening exposing the second doped region and covers the first doped region; forming a first silicide layer in the opening on the second doped region; depositing a barrier layer over the first doped region; and annealing the barrier layer to form a second silicide layer on the first doped region.

20 Claims, 19 Drawing Sheets

METHOD OF MANUFACTURING AN OPTICAL SENSOR

BACKGROUND

A depth detection sensor or a ranging sensor is used to determine a distance between an optical sensor and an object. The optical sensor may be formed of an array of light-sensing pixels, in which each pixel is used to capture light reflected by the object. The time delay or phase difference between the transmitted light and the captured light is utilized to determine the distance between the pixel and the object.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
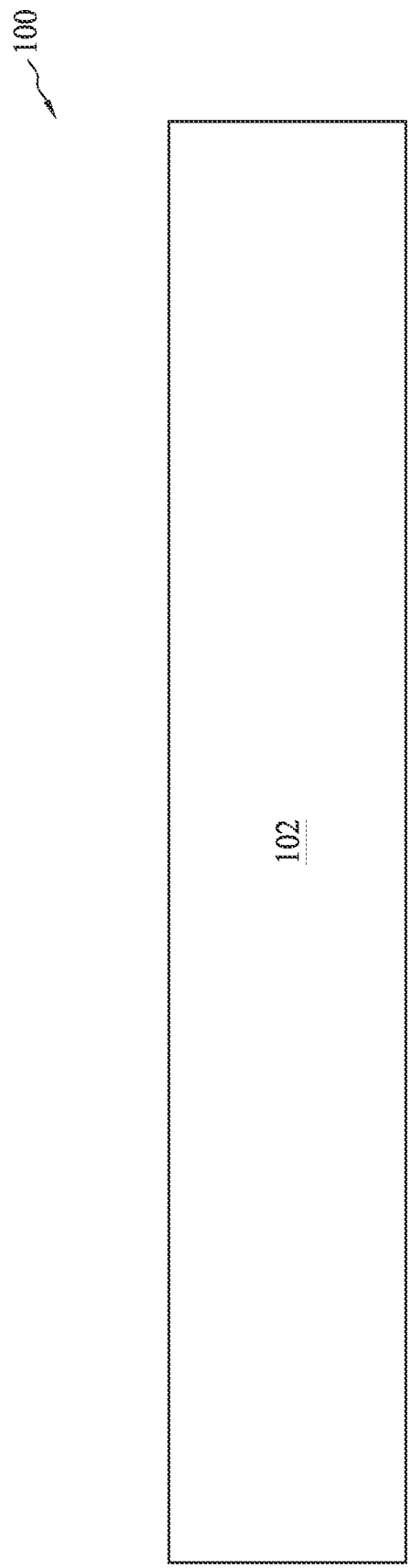
FIG. 1 to FIG. 14 are cross-sectional views of intermediate structures of a method of manufacturing a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an optical sensor and method of manufacturing the same. An optical sensor disclosed herein is used to sense a depth distribution or topography information of an object or a distance between the optical sensor and the object by detecting a time delay of an optical signal, e.g., laser light. The detection sensitivity of the optical sensor can be greatly enhanced by help of the advancement of the semiconductor manufacturing techniques. In some embodiments, the silicide layers used in the semiconductor optical sensor may aid in improving detection sensitivity by reducing electrical resistance of the conductive layers to which the silicide layer is coupled, thereby allowing current or electrons to pass through with reduced resistance. However, such low-resistance features may also easily attract free electrons resulting from dark current in the optical sensor, especially when the working temperature of the optical sensor is elevated, e.g., to above 80° C. or 120° C. As a result, the dark current may lead to high noise, which compromises the detection sensitivity of the optical sensor.

In the present disclosure, the optical sensor is improved by effectively managing the areas of one or more resistance-reducing layers, such as the silicide layers formed adjacent to the conductive layers. Through limiting the silicide layers to be formed on only some of the conductive vias of the optical sensor, the sources of attracting the electrons of dark current may be reduced or mitigated, and the optical sensor can be operated by seeking better balance between detection sensitivity and noise suppression.

FIG. 1 to FIG. 14 are cross-sectional views of intermediate structures of a method of manufacturing a semiconductor structure 100, in accordance with some embodiments. In some embodiments, the semiconductor structure 100 is an optical sensor or a depth sensor configured to capture light. In some embodiments, the semiconductor structure 100 is configured to detect a depth of an object or distance between the object and the semiconductor structure 100 based on the time delay (or time of flight) of the captured light. In some embodiments, the light source used for the semiconductor structure 100 has a wavelength in a range of between about 850 nm (nanometers) and about 1600 nm.

Referring to FIG. 1, a substrate 102 is received or provided. The substrate 102 (also referred to as a die substrate) includes a bulk semiconductor material, such as silicon. In one embodiment, the substrate 102 may include other semiconductor materials, such as silicon germanium, silicon carbide, gallium arsenide, or the like. The substrate 102 may be of a first conductivity type, e.g., a P-type semiconductive substrate (acceptor type), or of a second conductivity type, e.g., an N-type semiconductive substrate (donor type). Alternatively, the substrate 102 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In another alternative, the substrate 102 may be a semiconductor-on-insulator (SOI). In still other alternatives, the substrate 102 may include a doped epitaxial layer, a gradient semiconductor layer, or a semiconductor layer overlaying another semiconductor layer of a different type, such as a silicon layer on a silicon germanium layer.

Figure 2:
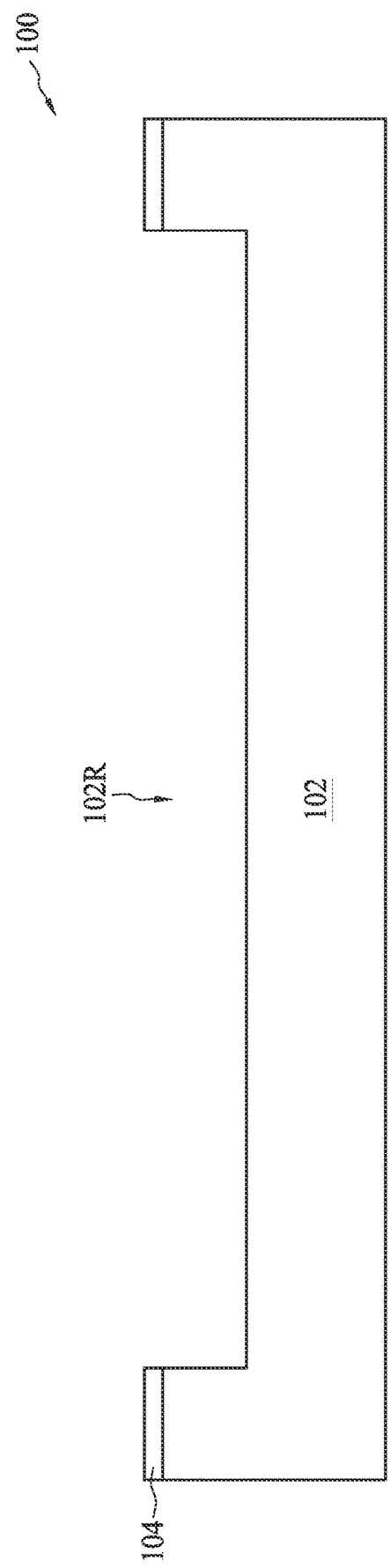

Referring to FIG. 2, a mask layer 104 is deposited over the substrate 102, In some embodiments, the mask layer 104 is formed of a dielectric layer, such as silicon nitride, silicon oxide, silicon carbide, silicon oxynitride, or other suitable materials. In the present embodiment, the mask layer 104 is formed of oxide. The mask layer 104 can be deposited over the substrate 102 by physical vapor deposition (PVD), chemical vapor deposition (CVD), atomic layer deposition (ALD), thermal oxidation, thermal nitridation, spin coating, or other suitable deposition methods.

The mask layer 104 is patterned into a patterned mask layer 104. The patterned mask layer 104 may be formed by photolithography and etching operations. An opening is formed in the mask layer 104 accordingly. The opening exposes the underlying substrate 102. As an exemplary procedure, the patterned mask layer 104 may be formed by depositing a photoresist layer (not shown) over the mask layer 104. An exposure operation is performed on the photoresist to transfer a predetermined trench pattern to the photoresist layer. The exposure operation may be performed using an electron-beam (e-beam) writer. The e-beam writer generates a geometrically constrained stream of electrons that irradiate selected areas of the photoresist layer. One of ordinary skill in the art will recognize that any other suitable writer may be used for irradiating selected areas of the photoresist layer.

A development operation may be performed to remove the exposed portions using a developer. The pattern of the opening is formed in the photoresist layer and exposes an upper surface of the mask layer 104. The developer may be a positive-tone developer or a negative-tone developer. Therefore, a patterned photoresist layer is formed.

Subsequently, the mask layer 104 is etched with the patterned photoresist layer serving as an etching mask. The mask layer 104 may be etched using a dry etch, a wet etch or a combination thereof, e.g., reactive ion etch (RIE). Therefore, the patterned mask layer 104 is formed.

The substrate 102 is subsequently etched using the patterned mask layer 104 serving as the etching mask. The substrate 102 may be etched using a dry etch, a wet etch or a combination thereof. Therefore, the opening extends to the substrate to form a trench 102R in the substrate 102 in communication with the opening.

Figure 3:
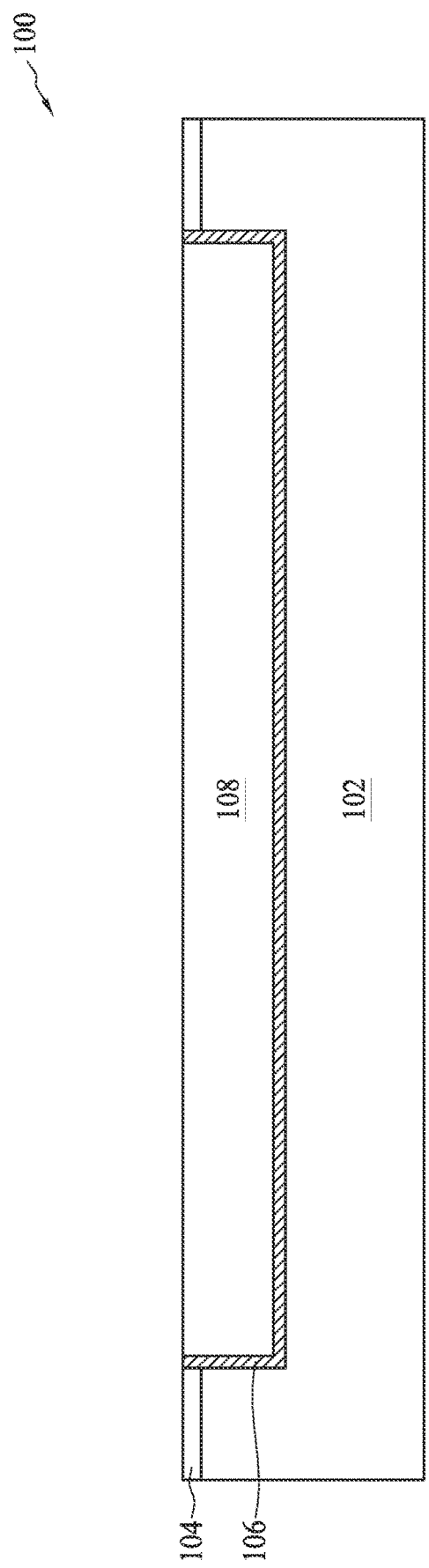

Referring to FIG. 3, a seed layer 106 is formed on sidewalls and the bottom of the trench 102R. The seed layer 106 may a semiconductor layer including semiconductor materials, such as silicon. Other semiconductor materials, e.g., germanium and silicon germanium may be alternatively used in the seed layer 106. In some embodiments, the seed layer 106 is an epitaxial layer epitaxially grown from the surface of the trench 102R.

A light-absorption layer 108 is formed over the seed layer 106 in the trench. The light-absorption layer 108 may be configured to convert the received photons of reflected light into electric current, in which the electron-hole pairs are generated in response to the impinging of the photons. In the present embodiment, the light-absorption layer 108 is formed of germanium. In some other embodiments, the light-absorption layer 108 is formed of silicon germanium or silicon. In some embodiments, materials of the light-absorption layer 108 and the seed layer 106 are in the same family, e.g., Group IV, of the periodic table. In some embodiments, the light-absorption layer 108 has a germanium atomic percentage, e.g., greater than 90% or greater than 95%, which is greater than the germanium concentration of the substrate 102 or the seed layer 106. In some embodiments, the light-absorption layer 108 is substantially dopant-free (i.e., having an extrinsic dopant concentration from about 0 $cm^{-3}$ to about $1\times10^{17}$ $cm^{-3}$), where for example, no intentional doping is performed during the formation of the light-absorption layer 108.

The light-absorption layer 108 may be formed in the trench 102R using CVD, PVD, ALD, remote plasma CVD (RPCVD), molecular beam epitaxy (MBE), vapor-phase epitaxy (VPE), liquid phase epitaxy (LPE), selective epitaxial growth (SEG), a combination thereof or the like. In some embodiments, a planarization operation may be performed to remove excess materials of the light-absorption layer 108, planarize the upper surface of the light-absorption layer 108 and level the upper surface of the light-absorption layer 108 with the patterned mask layer 104 and the seed layer 106. The planarization operation may be performed using chemical mechanical polishing (CMP), grinding, etching, or other suitable methods.

Figure 4:
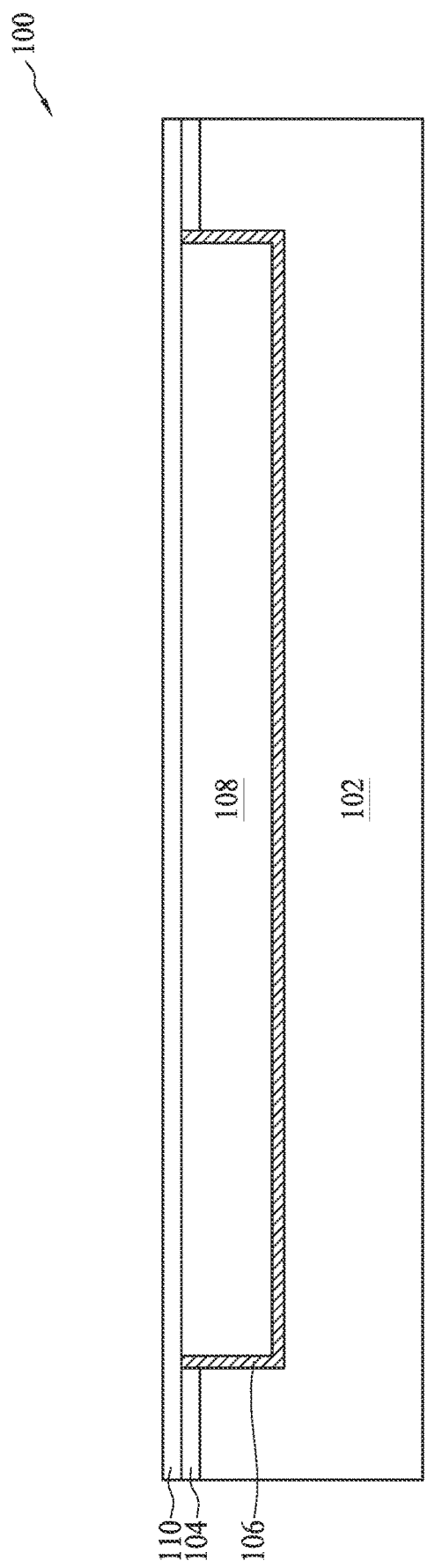

Referring to FIG. 4, a buffer layer 110 is deposited over the light-absorption layer 108. In some embodiments, the buffer layer 110 is used for protect the underlying light-absorption layer 108 and passivate the surface of the light-absorption layer 108 layer with a high germanium percentage in an attempt to reduce dark current or leakage current at the surface of the light-absorption layer 108. In some embodiments, the buffer layer 110 covers the light-absorption layer 108, the seed layer 106 and the patterned mask layer 104. In some embodiments, the buffer layer 110 is formed of a semiconductor material, such as silicon. The buffer layer 110 may be formed using CVD, PVD, ALD, MBE, LPE, VPE, SEG, or other suitable deposition methods.

Figure 5:
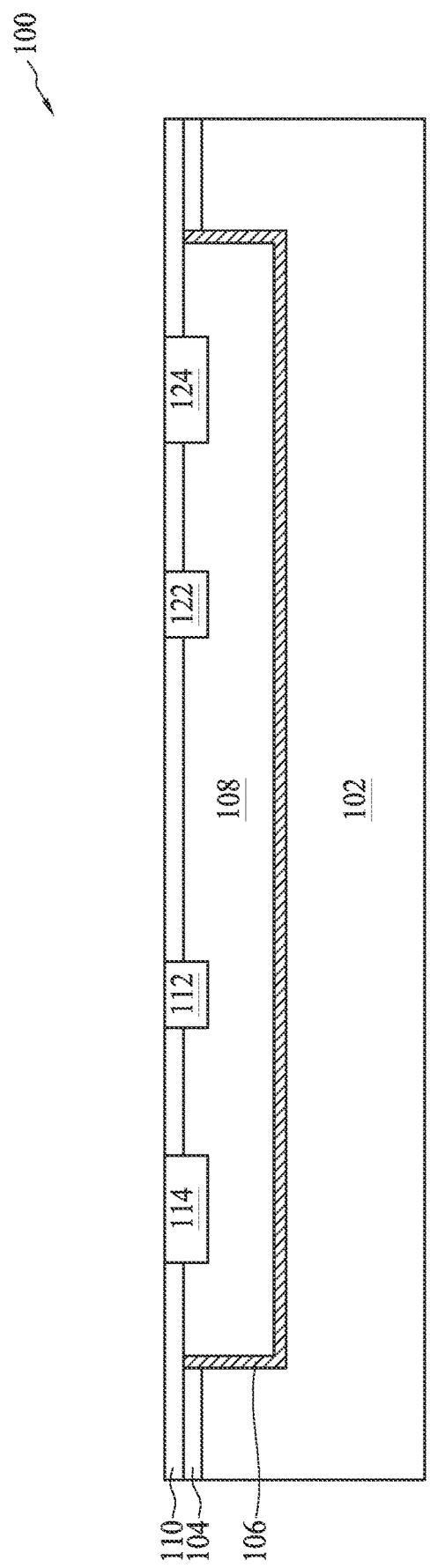

Referring to FIG. 5, one or more doped regions are formed in the buffer layer 110 and the light-absorption layer 108. Two P-type doped regions 112 and 122 are formed in the light-absorption layer 108. The dopants of the P-type doped regions 112, 122 may include P-type impurities, e.g., boron or indium. Two N-type doped regions 114 and 124 are formed in the light-absorption layer 108 on two sides of the P-type doped regions 112 and 122. The dopants of the N-type doped regions 114, 124 may include P-type impurities, e.g., phosphorus, arsenic or antimony. In some embodiments, the doping concentrations of the doped regions 112, 114, 122, 124 are in a range between about $1\times10^{18}$ and $5\times10^{20}$ $cm^{-3}$. In some embodiments, the doped regions 112, 114, 122, 124 are formed using an ion implantation and diffusion.

Figure 6:
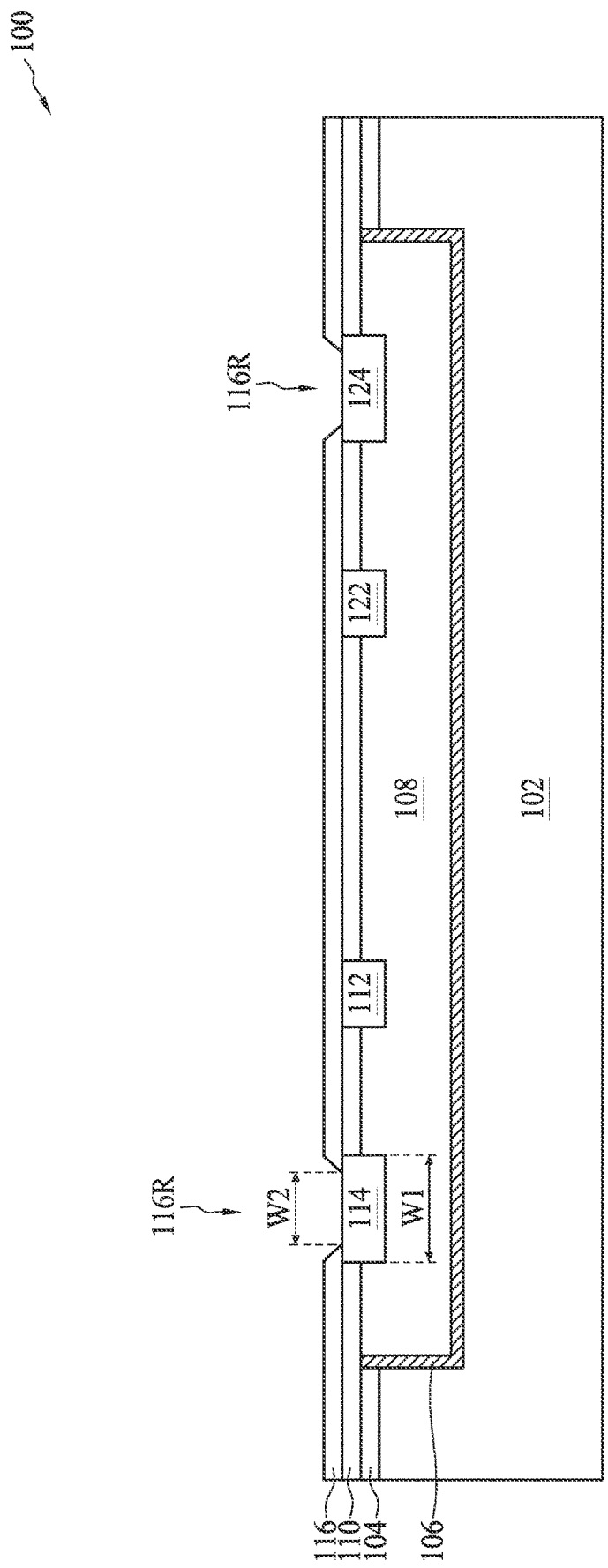

Referring to FIG. 6, a mask layer 116 is formed over the buffer layer 110. In some embodiments, the mask layer 116 is formed of a dielectric layer, such as silicon nitride, silicon oxide, silicon carbide, silicon oxynitride, or other suitable materials. In the present embodiment, the mask layer 116 is formed of oxide. The mask layer 116 can be deposited by PVD, CVD, ALD, thermal oxidation, thermal nitridation, spin coating, or other suitable deposition methods.

The mask layer 116 is patterned into a patterned mask layer 116. In some embodiments, the patterned mask layer 116 includes openings 116R exposing the N-type doped regions 114, 124. In some embodiments, the openings 116R have a width W2 less than a width W1 of the N-type doped regions 114, 124. In some embodiments, the P-type doped regions 112, 122 remain covered by the patterned mask layer 116 during the patterning of the mask layer 116. The patterned mask layer 116 may be formed by photolithography and etching operations.

Figure 7:
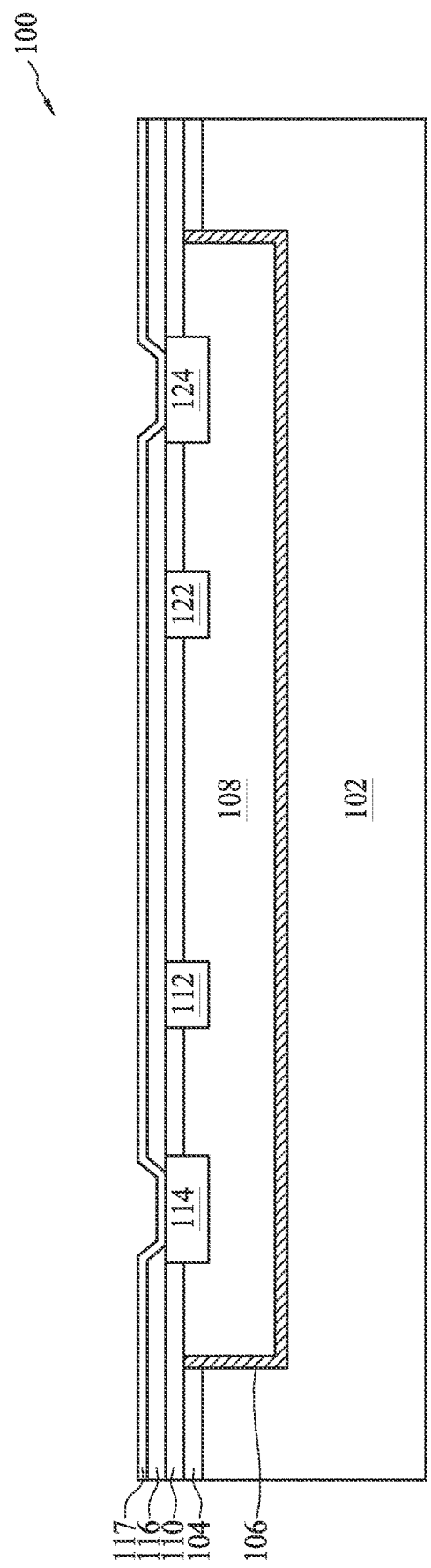
Figure 8:
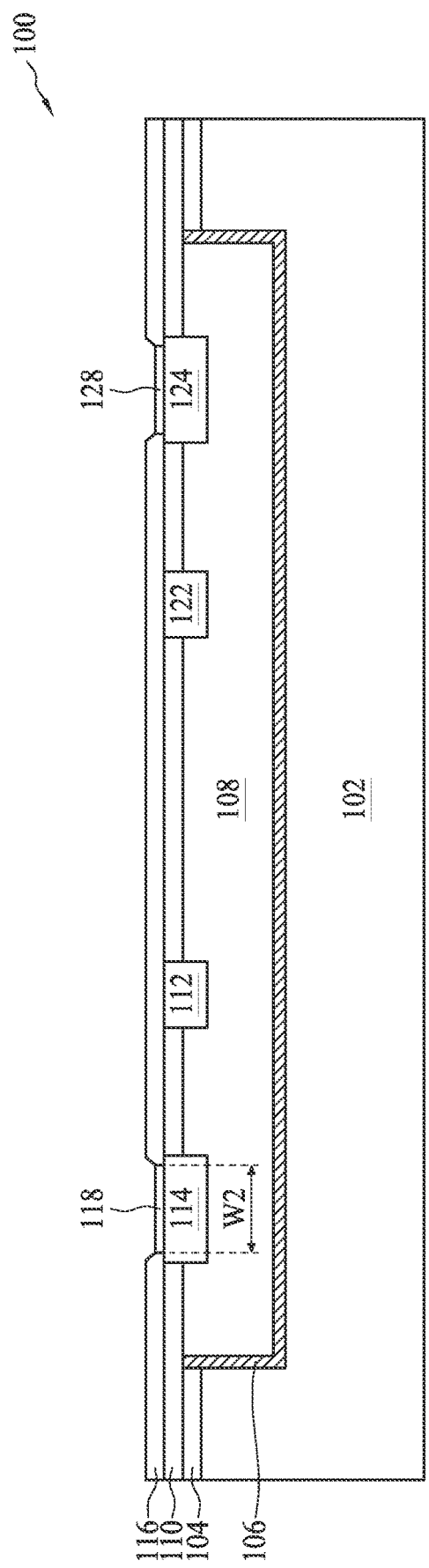

FIG. 7 and FIG. 8 illustrate the formation of the silicide layers 118, 128. Referring to FIG. 7, a conductive layer 117 is deposited over the patterned mask layer 116 and the openings 116R, The conductive layer 117 may be deposited on the surface of the patterned mask layer 116 and the sidewalk and the bottom of each of the openings 116R. The conductive layer 117 may include metal, such as Ni, Pd, Pt, Pa, Co, Ti, Al, Au; lanthanoids, such as La, Er, and Yb, or combinations thereof. In some embodiments, the conductive layer 117 is deposited to a thickness in a range between about 5 nm and about 20 nm, e.g., 15 nm. The conductive layer 117 is deposited using PVD, CVD, ALD, sputtering, or other suitable methods.

Under appropriate processing conditions, the metal of the conductive layer 117 reacts with silicon in the buffer layer 110 to thereby form silicide layers 118, 128. In some embodiments, a thermal operation is performed to facilitate the formation of the silicide layers 118, 128. In some embodiments, the thermal operation is performed in which an annealing temperature is in a rage between about 200° C. and about 500° C., e.g., 400° C. As a result, the silicide layers 118, 128 are formed at the interface between the conductive layer 117 and the patterned mask layer 116 within the openings 1168, as shown in FIG. 8. The silicide layers 118, 128 occupy a thickness of the respective doped regions 114, 124. The silicide layers 118, 128 may include, for example, metal silicide such as cobalt silicide (CoSix), molybdenum silicide (MoSix), nickel silicide (NiSix), titanium silicide (TiSix), and/or other materials. In the depicted embodiment, the self-aligned silicide layers 118, 128 are formed of nickel silicide.

In some embodiments, the silicide layers 118, 128 are formed only on the bottom of the respective opening 116R while being absent from the sidewalls of the respective opening 116R since the silicon atoms are provided only from the underlying patterned mask layer 116, As a result, the silicide layers 118, 128 are referred to herein as "self-aligned" silicide layers which are aligned with the N-type doped regions 114, 124 and defined by the openings 1168.

In some embodiments, portions of the conductive layer 117 which is not converted into a silicide form are selectively removed. As a result, the silicide layers 118 and 128 are remained as shown in FIG. 8. The selective removal of the conductive layer 117 may be performed using an etching operation, such as a wet etch. In some embodiments, the etchant gas used in the wet etch, e.g., ammonia hydroxide-hydrogen peroxide-water mixture (APM), has a sufficient etching selectivity between the conductive layer 117 and the silicide layers 118, 128 and the patterned mask layer 116 so as to prevent the silicide layers 118, 128 or the patterned mask layer 116 from being damaged during the removal of the conductive layer 117.

In some embodiments, an additional thermal operation is performed on the silicide layers 118, 128 to improve the performance of the silicide layers 118, 128.

Figure 9:
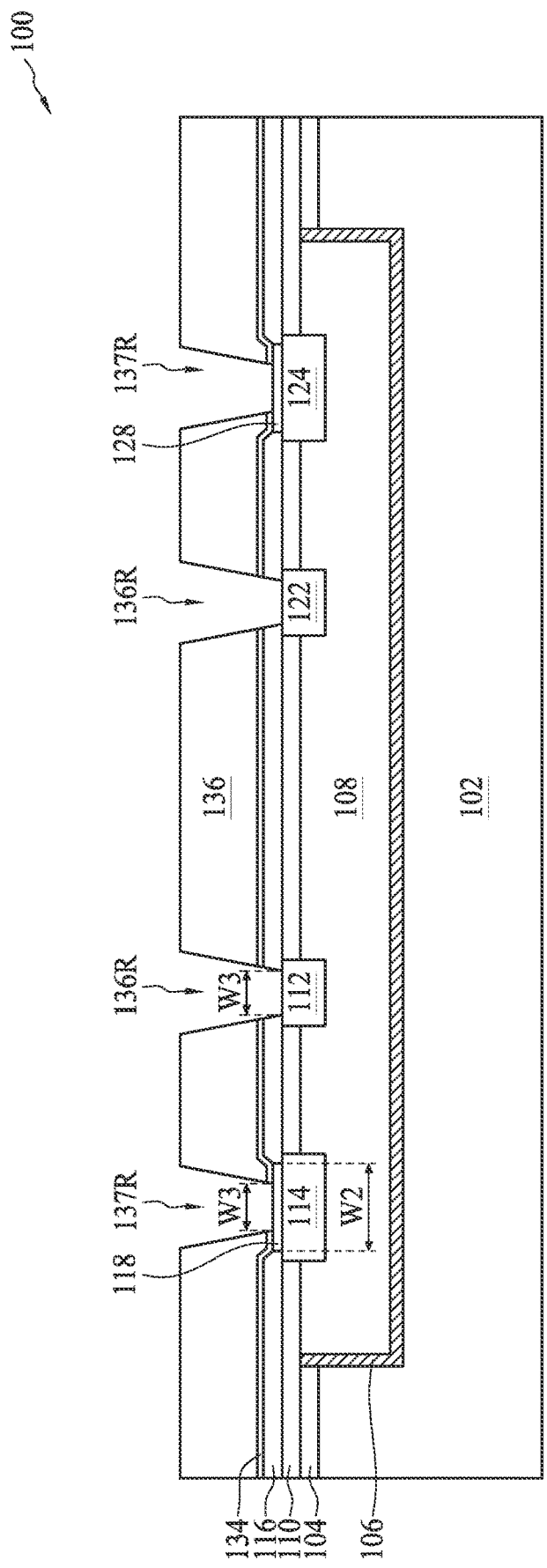

Referring to FIG. 9, a first dielectric layer 134 and a second dielectric layer 136 are successively deposited over the patterned mask layer 116 and the silicide layers 118, 128. In some embodiments, the first dielectric layer 134 serves as an etch stop layer. In some embodiments, the second dielectric layer 136 is referred to herein as an interlayer dielectric (ILD) layer. In some embodiments, the first dielectric layer 134 and the second dielectric layers 136 include dielectric materials, such as silicon nitride, silicon oxide, silicon carbide, silicon oxynitride, or other suitable dielectric materials. In the depicted example, the first dielectric layer 134 is formed of silicon nitride while the second dielectric layer 136 is formed of silicon oxide, e.g., such as un-doped silicate glass (USG), fluorinated silicate glass (FSG), borophosphosilicate glass (BPSG), tetraethoxysilane (TEOS), spin-on glass (SOG), high-density plasma (HDP) oxide, plasma-enhanced TEOS (PETEOS), or the like.

In some embodiments, the first dielectric layer 134 and the second dielectric layer 136 are deposited using CVD, PVD, ALD, RPCVD, spin coating, or the like. In some embodiments, the first dielectric layer 134 is deposited on the surface of the patterned mask layer 116 and the openings 116R in a conformal manner. In some embodiments, the second dielectric layer 136 is deposited to cover the first dielectric layer 134 and fill the openings 1168. In some embodiments, a planarization operation is performed to planarize the upper surface of the second dielectric layer 136. The planarization operation may include CMP, grinding, or other suitable etching methods.

The first dielectric layer 134 and the second dielectric layer 136 are patterned to form vias 136R and 137R extending through the second dielectric layer 136 and the first dielectric layer 134. The upper surfaces of the silicide layers 118, 128 are exposed through the vias 137R accordingly. In addition, the upper surfaces of the P-type doped regions 112, 122 also exposed through the corresponding vias 136R. In some embodiments, the vias 136R and 137R have a width W3 less than a width W2 of the silicide layers 118, 128.

The formation of the vias 136R, 137R may include lithography and etching operations. In some embodiments, a mask layer (not shown) including a pattern of the vias 136R and 137R is deposited over the second dielectric layer 136 to transfer the pattern of the vias 136R and 137R to the second dielectric layer 136 and the first dielectric layer 134, In some embodiments, the vias 136R and 137R include sidewalls tapering from the upper surface of the second dielectric layer 136 to the upper surface of the buffer layer 110. The mask layer may be stripped or removed after the vias 136R and 137R are formed.

Figure 10:
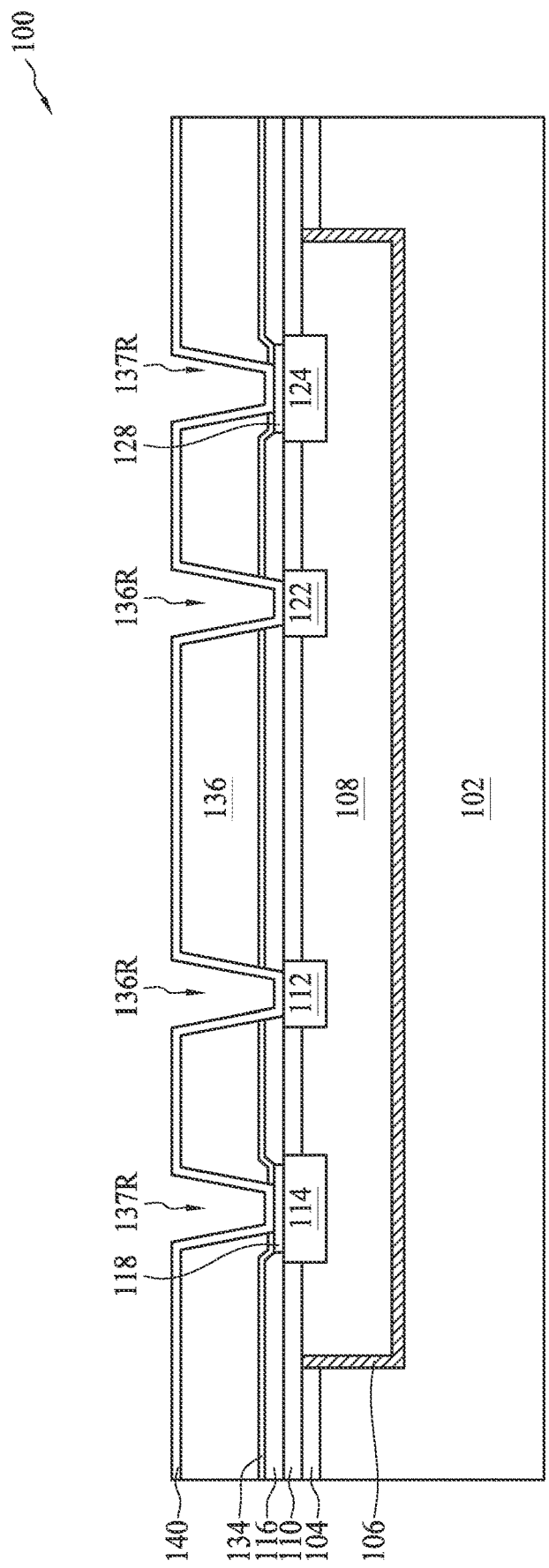

Referring to FIG. 10, a barrier layer 140 is deposited over the second dielectric layer 136 and the vias 136R and 137R. In some embodiments, the barrier layer 140 is configured to prevent conductive materials of the subsequently formed conductive via over the barrier layer 140 from diffusing into the second dielectric layer 136. In some embodiments, the barrier layer 140 serves as a glue layer. The barrier layer or glue layer 140 may be formed of conductive materials, such as titanium, titanium nitride, tantalum, tantalum nitride, or the like. In some embodiments, the barrier layer 140 includes a multilayer stack, e.g., a titanium layer and a titanium nitride layer over the titanium layer. The barrier layer 140 is lined to the sidewalls and the bottom of each of the vias 136R, 137R. In some embodiments, the barrier layer 140 is formed using CVD, PVD, ALD, electroplating or other suitable methods. In some embodiments, the barrier layer 140 is deposited to a thickness in a range between about 10 nm to about 30 nm. In some embodiments, a first sublayer, e.g., a titanium layer in the barrier layer 140 that is in contact with the P-type doped regions 112, 122 has a thickness in a range between about 5 mu and about 20 nm, e.g., 15 nm. In some embodiments, the barrier layer 140 has a thickness less than the thickness of the conductive layer 117.

Figure 11:
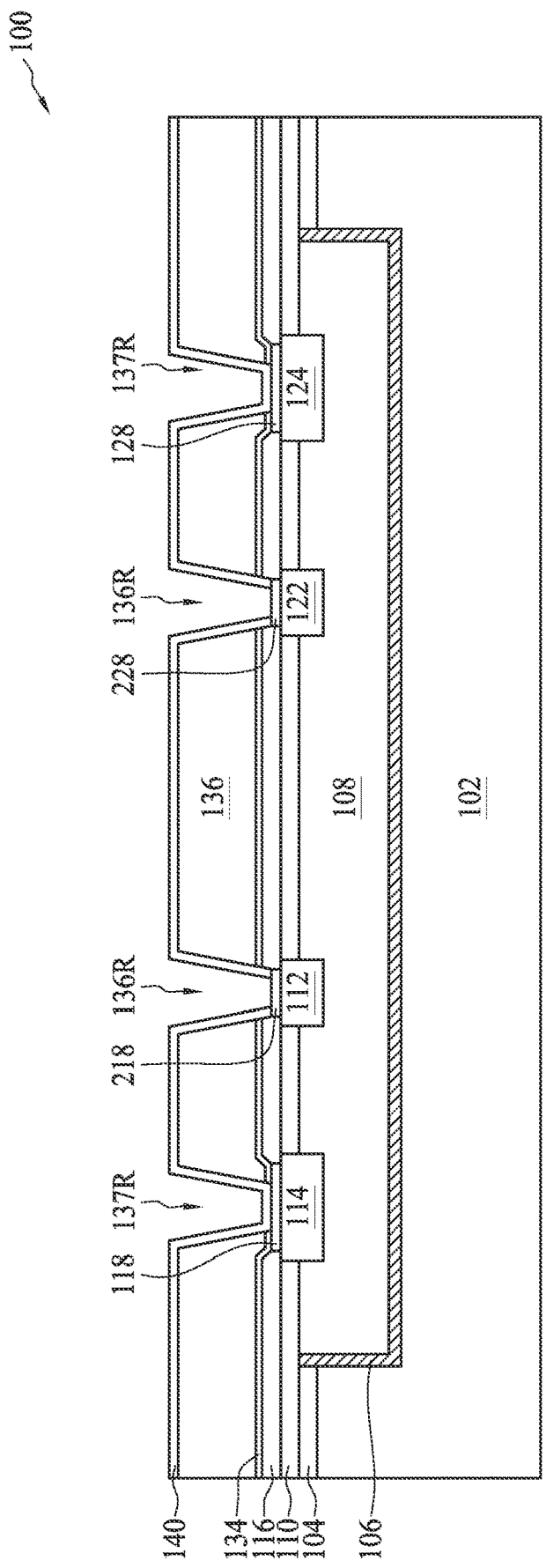

Referring to FIG. 11, during or after the formation of the barrier layer 140, silicide layers 218 and 228 are formed at the bottom portion of the barrier layer 140 in the vias 136R that expose the P-type doped regions 112, 122. Under appropriate processing conditions, the metal of the barrier layer 140, such as titanium, reacts with silicon in the P-type doped regions 112 and 122 to thereby form the respective silicide layers 218, 228. In some embodiments, a thermal operation is performed to facilitate the formation of the silicide layers 218, 228. In some embodiments, the thermal operation is performed in which an annealing temperature is in a rage between about 200° C. and about 500° C. In some embodiments, the barrier layer 140 is deposited at a high temperature, and thus the silicide layers 218, 228 are formed during the formation of the barrier layer 140. As a result, the silicide layers 218, 228 are formed at the interface between the barrier layer 140 and the P-type doped regions 112, 122 within the respective openings 116R. Although not shown, the silicide layers 218, 228 occupy a thickness of the P-type doped regions 112, 122. The silicide layers 218, 228 may include, for example, metal silicide such as cobalt silicide (CoSix), molybdenum silicide (MoSix), nickel silicide (NiSix), titanium silicide (TiSix), and/or other materials. In the depicted embodiment, the metal for forming the silicide layers 218, 228 is different from the metal for forming the silicide layers 118, 128. For example, the silicide layers 218, 228 are formed of titanium silicide.

In some embodiments, the silicide layers 218, 228 are formed only on the bottom of the vias 136R corresponding to the P-type doped regions 112, 122 while being absent from the sidewalls of the respective vias 136R since the silicon atoms are provided only from the underlying doped regions 112, 122, As a result, the silicide layers 218, 228 are referred to herein as "non-self-aligned" silicide layers which are aligned with the P-type doped regions 112, 122. In some embodiments, the non-self-aligned silicide layers 218, 228 are absent from the portions of the barrier layer 140 in the vias 137R over the N-type doped regions 114, 124.

In some embodiments, since the barrier layer 140 has a thickness less than the thickness of the conductive layer 117, the non-self-aligned silicide layers 218, 228 has a thickness less than the thickness of the self-aligned silicide layers 118, 128. In some embodiments, the upper surface of the silicide layer 118 or 128 is higher than the upper surface of the silicide layer 218 or 228. In some embodiments, the lower surface of the silicide layer 218 or 228 is lower than the lower surface of the silicide layer 118 or 128 due to a greater amount of reacting metal in the conductive layer 117 than that in the barrier layer 140.

Figure 12:
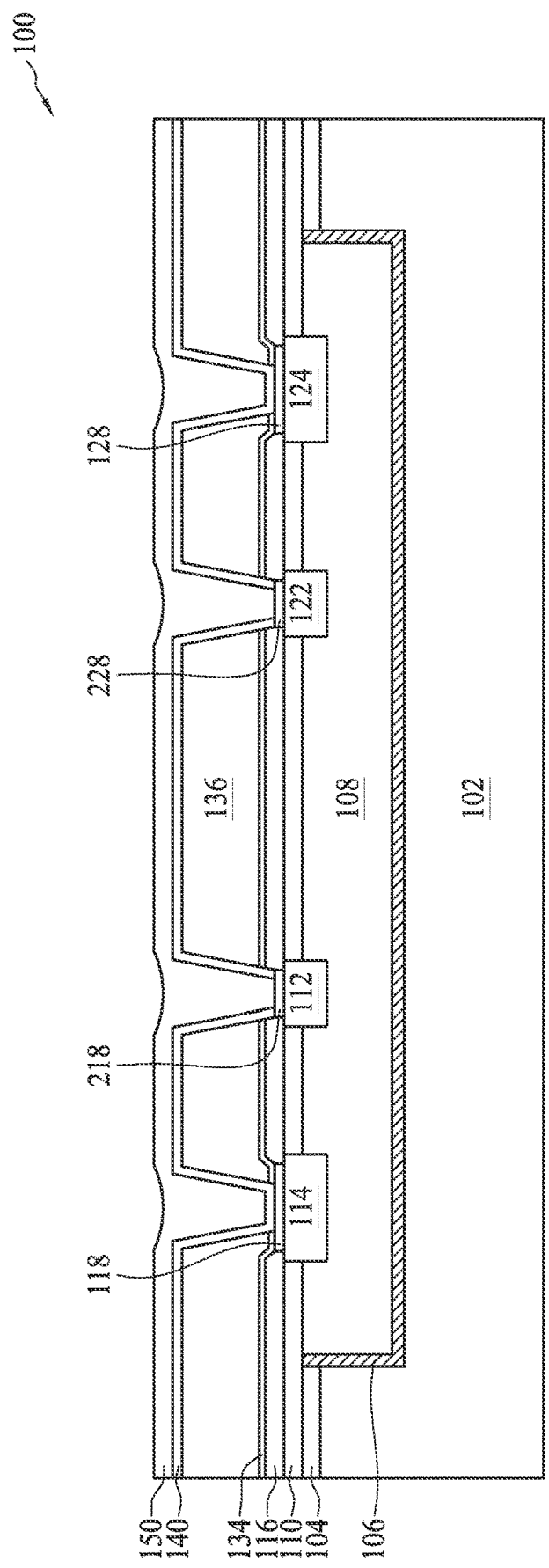

Referring to FIG. 12, a conductive material 150 is deposited over the barrier layer 140 and fill the vias 136R, 137R. The conductive material 150 may include tungsten, copper, aluminum, gold, silver, titanium, titanium nitride, alloy thereof, or the like. The conductive material 150 is deposited using CVD, PVD, ALD, sputtering, electroplating, or other suitable deposition methods.

Figure 13:
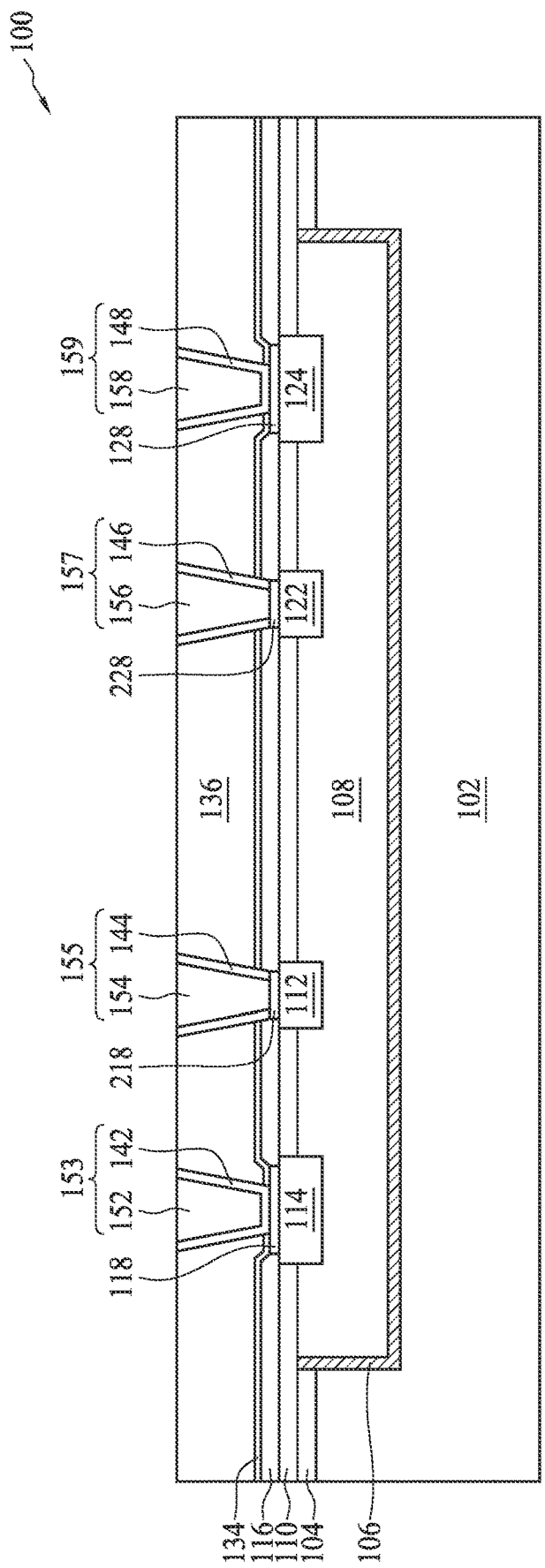

FIG. 13 illustrates the formation of the conductive vias 153, 155, 157 and 159. A planarization operation is performed to remove the excess portion of the conductive material 150 and level the upper surface of the conductive material 150 with the upper surface of the second dielectric layer 136. The planarization operation may be performed using CMP, grinding, etching or other suitable planarization methods. In addition, the horizontal portion of the conductive material 150 over the second dielectric layer 136 is also removed during the planarization operation. The conductive vias 153, 155, 157 and 159 are thus formed, each including the respective barrier layers 142, 144, 146 and 148 and the filling materials 152, 154, 156 and 158. In some embodiments, the silicide layers 218, 228 are not included in the conductive vias 155, 159.

Figure 14:
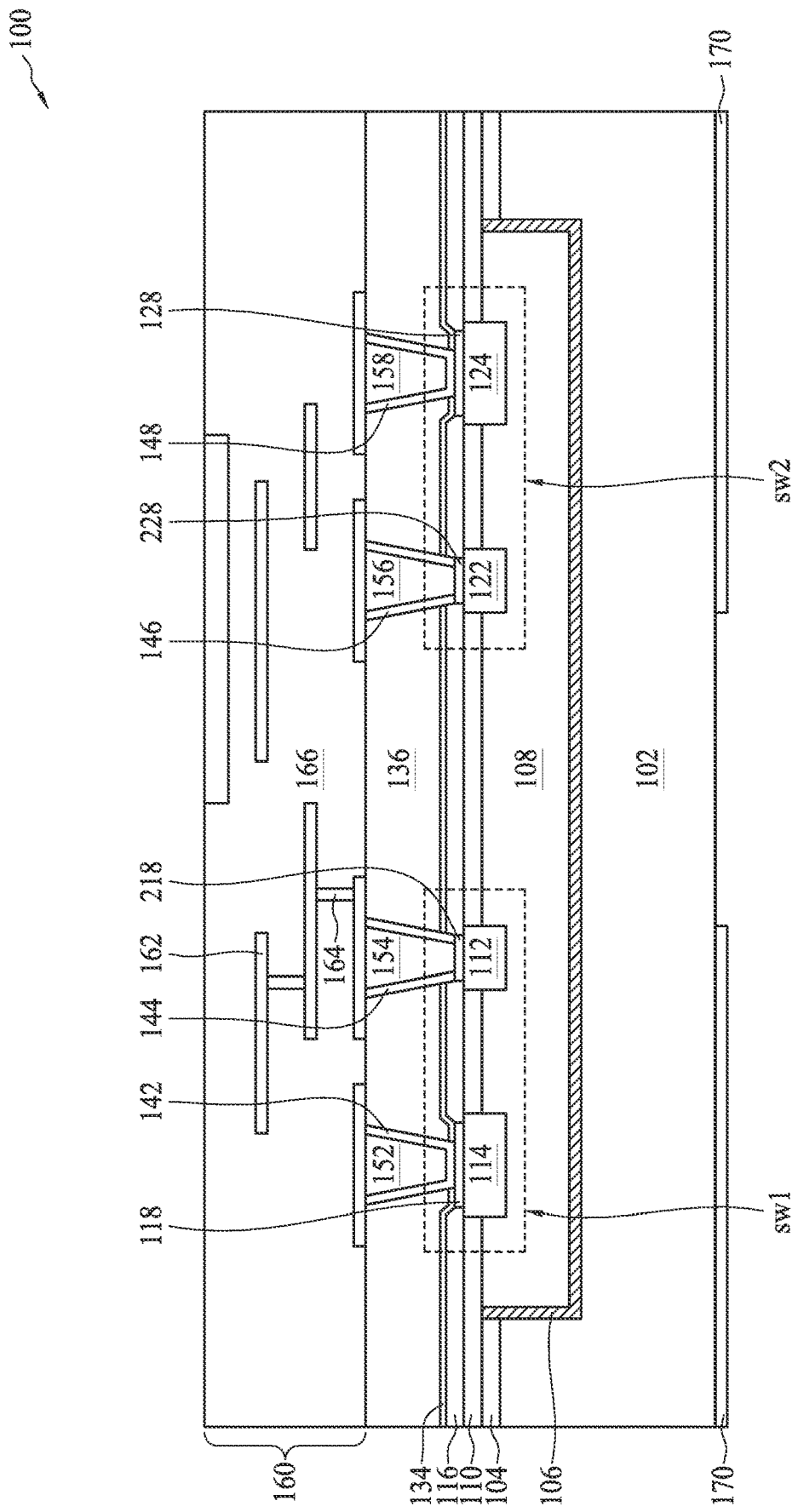

Referring to FIG. 14, an interconnect structure 160 is formed over the second dielectric layer 136 and the conductive vias 153, 155, 157 and 159. In some embodiments, the interconnect structure 160 is configured to electrically interconnect the components of the semiconductor structure 100. In some other embodiments, the interconnect structure 160 is configured to electrically couple an external circuitry to the electrical components of the semiconductor structure 100. The interconnect structure 160 may include multiple metallization layers. Each of the metallization layers may include conductive wires or lines and is electrically coupled to an adjacent overlaying or underlying metallization layer through conductive vias in an intermediate metallization layer. For example, several conductive lines 162 are disposed in different metallization layers of the interconnect structure 160 and are interconnected through corresponding conductive vias 164.

The conductive lines 162 and conductive vias 164 are electrically insulated from one another. The insulation may be achieved by insulating materials, such as inter-metal dielectric (IMD) layers 166, The dielectric material of the IMD layers 166 may be formed of low-k dielectric materials. The low-k dielectric materials may have dielectric constants (i.e., k values) lower than 3.8, although the dielectric materials of the IMD layer 166 may be close to 3.8. In some embodiments, the k values of the low-k dielectric materials are lower than about 3.0 or lower than about 2.5. In an embodiment, the IMD may be formed with a variety of dielectric materials including, for example, oxides, such as un-doped silicate glass (USG), fluorinated silicate glass (FSG), Ge oxide, nitride, oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like.

Each of the MID layers 166 may define a respective metallization layer and be formed by initially forming a blanket MID material through a suitable process, such as CND, PVD, ALD, spin-on coating, or the like. Next, a photoresist (not separately shown) is formed over the blanket IMD material. Patterning operations, such as lithography and etching methods, are performed on the photoresist layer to form recesses in the IMD layer 166. The etching methods may include a dry etch, a wet etch, a combination thereof, e.g., a reactive ion etch (RIE), or the like.

Subsequently, one or more conductive materials are deposited into the recesses of the respective IMD layer 166 to form the conductive lines 162 or conductive vias 164. The materials of the conductive lines 162 and conductive vias 164 include, for example, titanium, tantalum, titanium nitride, tantalum nitride, copper, copper alloys, nickel, tin, gold, and combinations thereof. In some embodiments, the conductive lines 162 and conductive vias 164 comprise a layered structure with different conductive sublayers. For example, seed layers are formed in a conformal manner on the bottoms and sidewalk of the respective recesses prior to the forming of the conductive materials. The seed layers may be formed by a conductive material, such as titanium, titanium nitride tantalum, tantalum nitride, or the like. The seed layers may be formed using the (ND, PVD, ALD, electroplating, sputtering, or the like. Additionally or alternatively, barrier layers or glue layers may be deposited over the seed layers or the IMD layers 166.

In some embodiments, a shielding layer 170 is formed on a bottom surface of the substrate 102. The shielding layer 170 is configured to block the light from reaching the features under the shielding layer 170 and direct the light to impinge on the light-absorption layer 108 through a light path. In some embodiments, the shielding layer 170 is formed of a metallic material, such as aluminum or copper. In some embodiments, the shielding layer 170 exposes an area of the light-absorption layer 108 between the P-type doped region 112 and the P-type doped region 122 to facilitate light absorption. In some embodiments, the shielding layer 170 overlaps the P-type doped regions 112, 122 and the N-type doped regions 114, 124 in order to block the impinging light from reaching these doped regions during sensing.

As discussed previously with reference FIG. 11, the silicide layers 218, 228 can be formed subsequent to the deposition of the barrier layer 140 prior to the deposition of the conductive material 150. However, the silicide layers 218, 228 can be formed in any steps subsequent to the deposition of the barrier layer 140 when the barrier layer 140 undergoes a thermal operation in other steps. For example, the operations shown in FIGS. 12-14 or beyond the step shown in FIG. 14 may be performed along with a thermal operation, which would aid in formation of the silicide layers 218, 228.

In some embodiments, the P-type doped region 112 and the N-type doped region 114 form a first switch sw1 of the semiconductor structure 100. In some embodiments, the P-type doped region 112 is coupled to a first control signal (not shown) through the interconnect structure 160 and the N-type doped region 114 is coupled a first readout circuit (not shown) through the interconnect structure 160. Similarly, the P-type doped region 122 and the N-type doped region 124 form a second switch sw2 of the semiconductor structure 100. In some embodiments, the P-type doped region 122 is coupled to a second control signal (not shown) through the interconnect structure 160, and the N-type doped region 124 is coupled a second readout circuit (not shown) through the interconnect structure 160.

As the light-absorption layer 108 absorb photons in the impinging optical signal, the photons are converted into electron-hole pairs to drift in the substrate 102. When the P-type doped regions 112, 122 are biased at appropriated voltages through the first and second control signals, an electric field is created between the P-type doped region 112 and the P-type doped region 122, and free electrons in the light-absorption layer 108 drift towards the P-type doped region 112 or the P-type doped region 122 depending on the direction of the electric field. In some embodiments, the direction of the biasing voltages determines the drift direction of the electrons. Accordingly, when one switch (e.g., the first switch sw1) is switched "on" (i.e., the electrons drift towards the P-type doped region 112), the other switch (e.g., the second switch sw2) is switched "off" (i.e., the electrons are blocked from the P-type doped region 122) and vice versa.

In the first switch sw1, an electric field is created between the P-type doped region 112 and the N-type doped region 114. Similarly, in the second switch sw2, an electric field is created between the P-type doped region 122 and the N-type doped region 124. When the first switch sw1 is switched "on" and the second switch sw2 is switched "off", the electric field formed in the first switch sw1 further moves the electrons to the N-type doped region 114. The first readout circuit may receive and process the charges collected by the N-type doped region 114. Similarly, when the second switch sw2 is switched "on" and the first switch sw1 is switched "off", the electric field formed in the second switch sw2 further moves the electrons to the N-type doped region 124, The second readout circuit may receive and process the charges collected by the N-type doped region 124.

In some embodiments, when the semiconductor structure 100 serving as an optical sensor is operated at a relatively high temperature, free electrons, which are irrelevant to the impinging optical signal, may be found around the junctions or interfaces between the various layers of the semiconductor structure 100. The crystalline defects or traps may cause these free electrons to drift and to be absorbed by the N-type doped region 114, 124 during operation, thereby leading to dark current even when no light is incident on the light-absorption layer 108. In some embodiments, the effect of the dark current is more pronounced around the conductive features close to the doped regions 112, 114, 122, 124 since the free electrons may tend to accumulate around the junctions formed by these conductive features and their adjacent features. For example, the silicide layers that are otherwise formed between the conductive vias 155, 157 and the P-type doped regions 112, 122 may lead to increased dark current. In some embodiments, the resultant dark current is increased with the areas of the protruding portions of these silicide layers extending from the sidewalls of the conductive vias 155, 157 because of a higher likelihood of crystalline defects at the junctions between these protruding areas and their adjacent features near the P-type doped regions 112, 122.

In view of the foregoing, in order to eliminate or reduce the dark current effect, the self-aligned silicide layers are absent from over the P-type doped regions 112, 122. As shown in FIG. 14, the self-aligned silicide layers 118, 128 are formed only on the N-type doped regions 114, 124 while non-self-aligned silicide layers 218, 228 are formed on the P-type doped regions 112, 122.

Figure 15:
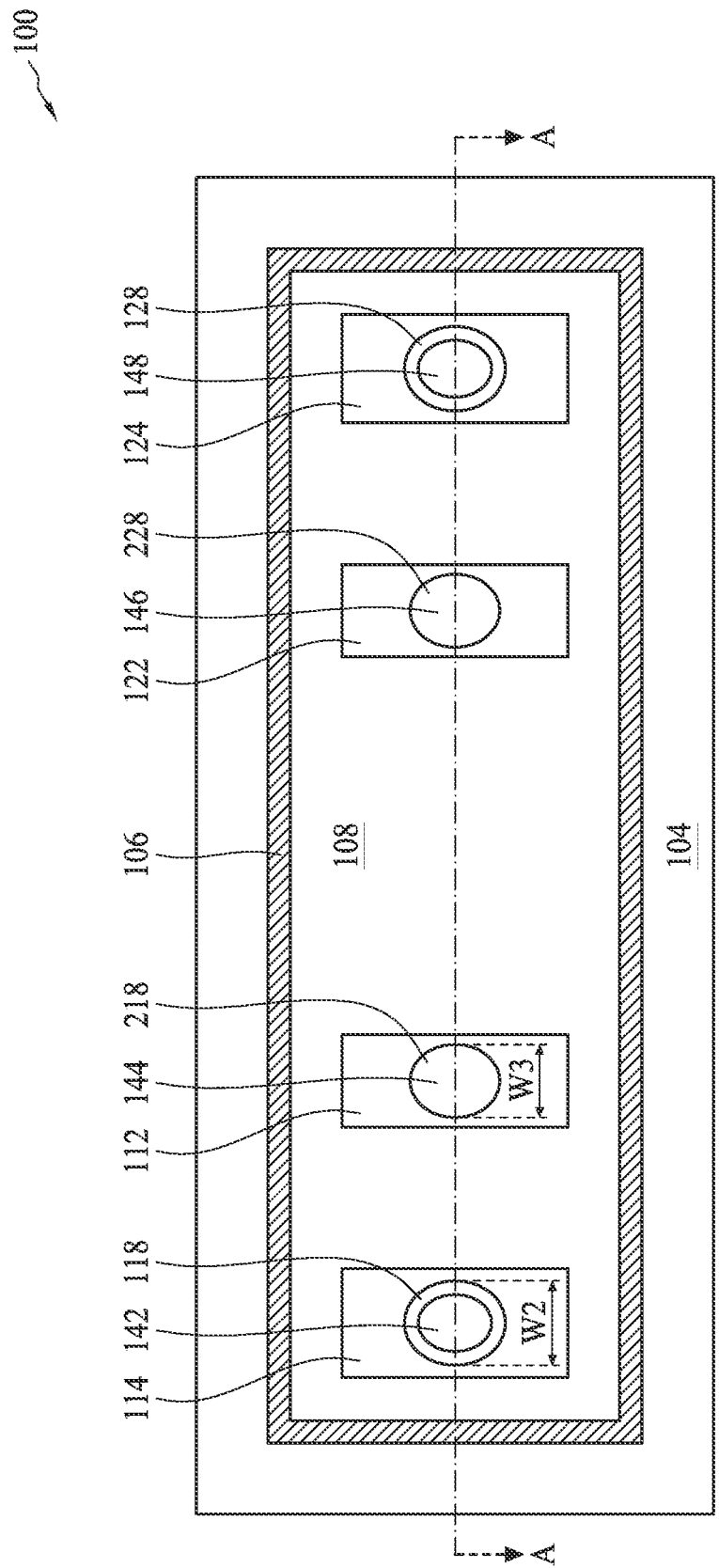
FIG. 15 is a plan view of the semiconductor structure shown in FIG. 13, in accordance with some embodiments.

FIG. 15 shows a plan view of the semiconductor structure 100 shown in FIG. 13, in which the cross-sectional view of FIG. 13 is taken along the sectional line AA. Some features, e.g., the buffer layer 110, the patterned mask layer 116 and the first and second dielectric layers 134, 136 are removed from the plan view of FIG. 15 for clarity. As discussed previously, the non-self-aligned silicide layers 218, 228 formed during the formation of the barrier layer 140 still remain over the P-type doped regions 112, 122, respectively. As shown in FIG. 14 and FIG. 15, the areas or widths W3 of the silicide layers 218, 228 are less than the areas or widths W2 of the silicide layers 118, 128. In some embodiments, the silicide layers 218, 228 do not protrude from the sidewalls of the respective barrier layers 144, 146. Therefore, the dark current is greatly reduced especially under the scenario of a high working temperature, and thus the signal-to-noise ratio is increased. The detection sensitivity is improved accordingly.

In some embodiments, referring to FIG. 9 and FIG. 14, the vias 136R, 137R have a width W3 less than the width W2 of the silicide layers 118, 128, where the silicide layers 218, 228 are formed with widths W3 according to the widths W3 of the vias 136R, 137R. Although the silicide layers 218, 228 are arranged between the conductive materials 154, 156 and the P-type doped regions 112, 122, respectively, their widths W3 are less than those in existing methods. As a result, the electrical resistance of the conductive vias 155, 157 can be reduced to some acceptable extent while the dark current can be well controlled. In some embodiments, the silicide layers 218, 228 have sidewalls substantially aligned with the sidewalls of the barrier layers 144, 146 of the conductive vias 155, 157. In contrast, the self-aligned silicide layers 118, 128 protrude from the sidewalls of the barrier layers 142, 148 of the respective conductive vias 153, 159, In some embodiments, a width ratio between the width W2 and the width W3 is between about 2 and about 6, or between about 3 and about 5, such as about 4.

Figure 16:
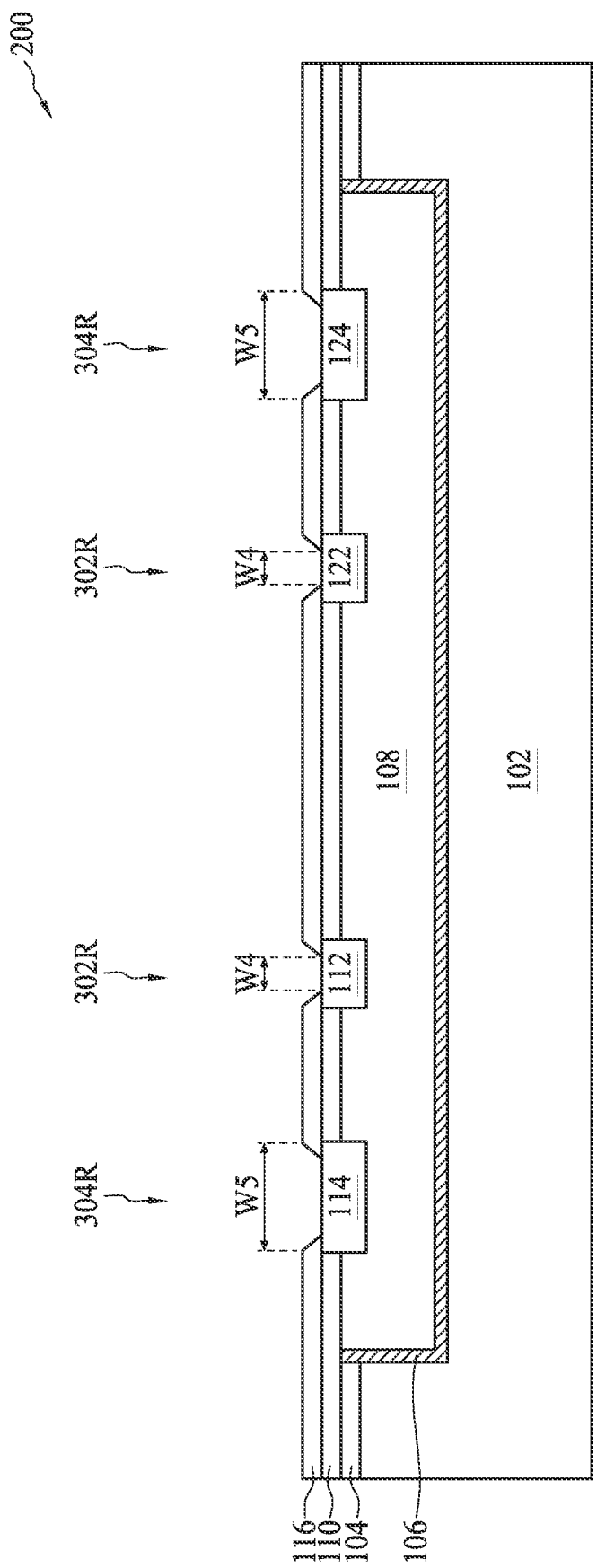
FIG. 16 and FIG. 17 are cross-sectional views of intermediate structures of a method of manufacturing a semiconductor structure, in accordance with some embodiments.
Figure 17:
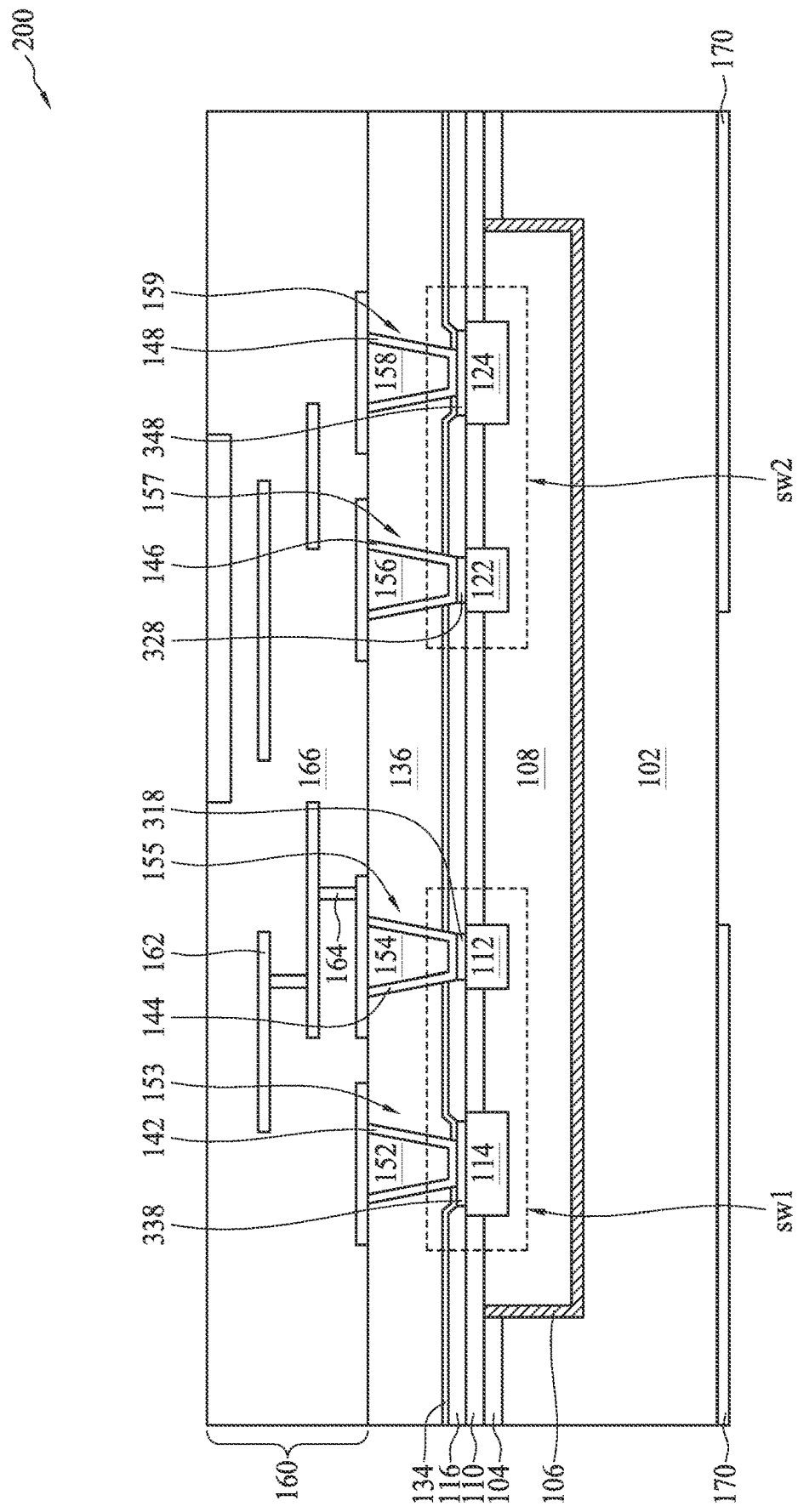

FIG. 16 to FIG. 17 are cross-sectional views of intermediate structures of a method of manufacturing a semiconductor structure 200, in accordance with some embodiments. The method of manufacturing the semiconductor structure 200 is similar to that for forming the semiconductor structure 100, except for the arrangements of the silicide layers, details of which are provided below. For simplicity and clarity, the features, steps and cross-sectional views similar to those shown in FIG. 1 to FIG. 15 and applicable to the method of forming the semiconductor structure 200 will be not repeated herein for simplicity unless stated otherwise.

Referring to FIG. 16, the patterned mask layer 110 as is provided in a similar way to that shown in FIG. 6, except that the patterned mask layer 110 shown in FIG. 16 further includes openings 302R over the P-type doped regions 112, 122 in addition to openings 304R over the N-type doped regions 114, 124. The widths W4 of the openings 302R or the widths W5 of the openings 304R are configurable such that the self-aligned silicide layers subsequently formed thereon have widths or areas as desired. In some embodiments, the width W5 is substantially equal to the width W2. In some other embodiments, the width W5 is substantially equal to the width W3 of the vias 136R, 137R, i.e., the width W3 of the conductive vias 153, 155, 157, 159. In some embodiments, the width W4 is substantially equal to the width W3.

In some embodiments, the width W4 is substantially equal to or less than the width W5. In some embodiments, a width ratio between the width W5 and the width W3 is between about 1.0 and about 6.0, or between about 2.0 and about 5.0, such as about 4.0. In some embodiments, a width ratio between the width W5 and the width W4 is between about 1.0 and about 6.0 or between about 2.0 and about 5.0, such as about 4.0.

Referring to FIG. 17, the semiconductor structure 200 is fabricated according to the patterned mask layer 116 shown in FIG. 16, in which the intermediate stages therebetween are omitted for simplicity. Most of the features shown in FIG. 17 are similar to those in FIG. 14, in which the materials, methods, configurations and dimensions described with reference to FIG. 1 to FIG. 14 are applicable to FIG. 16 and FIG. 17. It should be noted that the semiconductor structure 200 is different from the semiconductor structure 100 mainly in that self-aligned silicide layers 318, 328 are formed on the P-type doped regions 112, 122 with respective widths W4. The barrier layers 144, 146 are formed over the self-aligned silicide layers 318, 328, respectively. In some embodiments, no silicide layers are formed in the barrier layers 144, 146 in the presence of the self-aligned silicide layers 318, 328, Self-aligned silicide layers 338, 348 are formed on the N-type doped regions 114, 124 with respective widths W5 in a similar manner to that of the self-aligned silicide layers 118, 128. According to the arrangement of the openings 302R and 304R in the patterned mask layer 116 as shown in FIG. 16, the self-aligned silicide layers 318, 328 have areas or widths W4 less than the areas or widths W5 of the self-aligned silicide layers 338, 348. In some embodiments, the width W4 is reduced such that the sidewalls of the self-aligned silicide layers 318, 328 are substantially aligned with the sidewalls of the respective conductive vias 153, 155. As a result, the dark current effect can be eliminated or decreased due to the reduced widths W4 of the self-aligned silicide layers 318, 328. In some embodiments, the width W5 can be adjusted in a manner to that of the width W4 such that the sidewalls of the self-aligned silicide layers 338, 348 are substantially aligned with the sidewalls of the respective conductive vias 153, 159, In some embodiments, the width W4 or W5 of the silicide layers 318, 328, 338, 348 are less than the corresponding conductive vias 155, 157, 153, 159.

In some embodiments, the self-aligned silicide layers 118, 128 do not protrude from the sidewalk of the barrier layers 142, 128, respectively, in order to further reduce dark current. In some embodiments, the silicide layers 118, 128 have sidewalk substantially aligned with the sidewalls of the barrier layers 142, 148 of the conductive vias 153, 159. In some embodiments, the width W4 of the silicide layers 218, 228 or the width W5 of the silicide layers 118, 128 is less than the width W3 of the respective conductive vias 153, 155, 157, 159.

Figure 18:
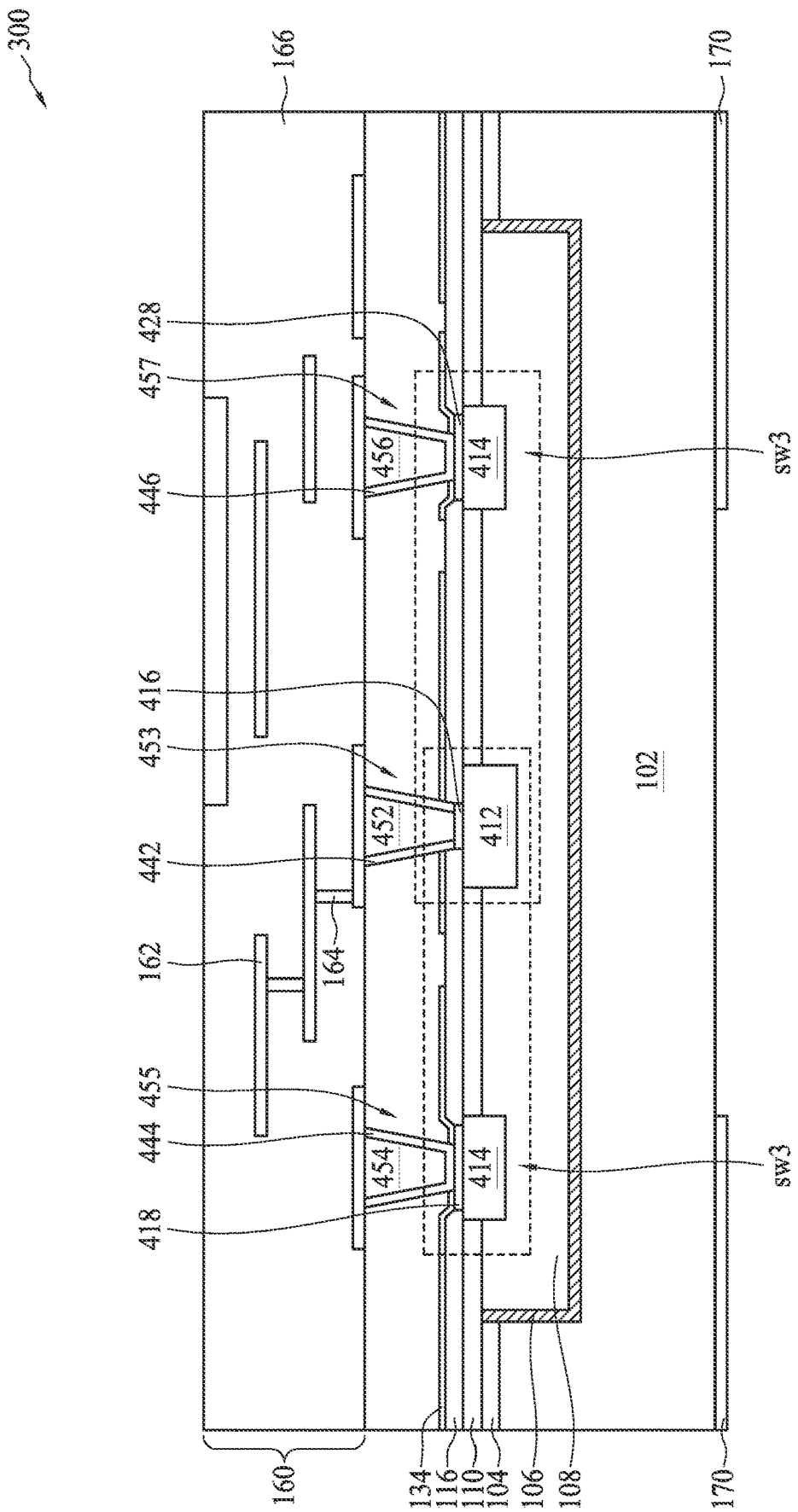
FIG. 18 and FIG. 19 are a cross-sectional view and a plan view, respectively, of a semiconductor structure, in accordance with some embodiments.
Figure 19:
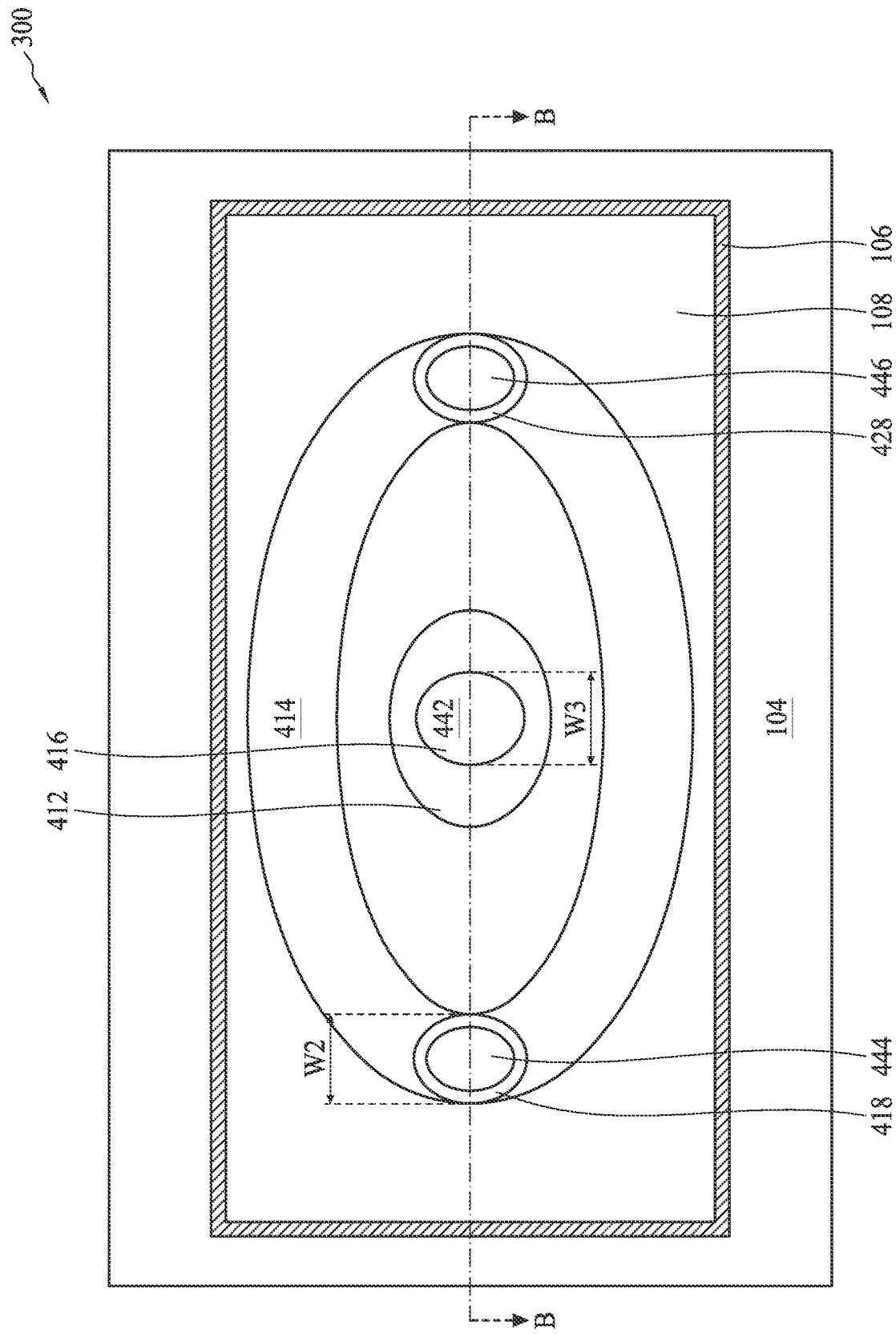

FIG. 18 and FIG. 19 are a cross-sectional view and a plan view, respectively, of a semiconductor structure 300, in accordance with some embodiments. Unless stated otherwise, the configurations, materials, dimensions and method of forming for the semiconductor structure 300 are similar to those described with reference to FIG. 1 to FIG. 17, and their descriptions are omitted.

The semiconductor structure 300 is different from the semiconductor structure 100 or 200 mainly in that the optical sensor implemented by the semiconductor structure 300 includes only one switch 300 formed by an N-type doped region 412 and a P-type doped region 414. Referring to the plan view shown in FIG. 19, the P-type doped region 414 may have a circular or ring shape and laterally surround the N-type doped region 412.

A conductive via 453, including a barrier layer 442 and a conductive material 452, is electrically coupled to the N-type doped region 412. A conductive via 455, including a barrier layer 444 and a conductive material 454, and a conductive via 457, including a barrier layer 446 and a conductive material 456, are electrically coupled to opposite sides of the P-type doped region 414.

A non-self-aligned silicide layer 416, which is similar to the silicide layer 218 or 228, is formed from the barrier layer 444 arranged between the N-type doped region 412 and the conductive material 452. Self-aligned silicide layers 418 and 428, which is similar to the silicide layer 118 or 128, are formed between the P-type doped region 414 and the respective conductive vias 444 and 446. The configurations, materials, and method of forming of the silicide layers 416, 418 and 428 are similar to the silicide layers 118, 128, 218, 228, 318, 328, 338 and 348. The arrangements for the silicide layers 118, 128, 218, 228, 318, 328, 338 and 348 are applicable to the silicide layers 416, 418 and 428. For example, the non-self-aligned silicide layer 416 includes a width W3 less than a width W2 of the self-aligned silicide layers 418, 428. In some embodiments, a self-aligned silicide layer (not shown) is formed between the N-type doped region 416 to replace the non-self-aligned silicide layer 416.

In some embodiments, the shielding layer 170 shown in the semiconductor structure 300 is arranged to expose the area of the light-absorption layer 108 within the ring-shaped P-type doped region 414. The N-type doped region 412 is also exposed through the shielding layer 170. The shielding layer 170 may overlap the P-type doped region 414 for improving the performance of light absorption.

According to an embodiment, a method of manufacturing a semiconductor structure includes: forming a light-absorption layer in a substrate; forming a first doped region of a first conductivity type and a second doped region of a second conductivity type in the light-absorption layer adjacent to the first doped region; depositing a first patterned mask layer over the light-absorption layer, wherein the first patterned mask layer includes an opening exposing the second doped region and covers the first doped region; forming a first silicide layer in the opening on the second doped region; depositing a barrier layer over the first doped region; and annealing the barrier layer to form a second silicide layer on the first doped region.

According to an embodiment, a method of manufacturing a semiconductor structure includes: forming a light-absorption layer in a substrate; forming a first doped region of a first conductivity type and a second doped region of a second conductivity type in the light-absorption layer adjacent to the first doped region; forming a patterned mask layer over the light-absorption layer; forming a self-aligned silicide layer on the second doped region according to a pattern of the patterned mask layer; forming a patterned dielectric layer over the patterned mask layer, the patterned dielectric layer comprising a first via exposing the first doped region; and forming a non-self-aligned silicide layer in the first via on the first doped region.

According to an embodiment, an optical sensor includes a light-absorption layer arranged in a substrate, a first doped region of a first conductivity type and a second doped region of a second conductivity type arranged in the light-absorption layer adjacent to the first doped region, a first silicide, layer on the second doped region, a dielectric layer over the light-absorption layer, a first conductive via arranged in the dielectric layer and electrically coupled to the first silicide, layer, a second conductive via in the dielectric layer and electrically coupled to the first doped region, and a second silicide layer between the second conductive via and the first doped region. The second silicide layer has sidewalls substantially aligned with sidewalls of the second conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure,

What is claimed is:

1. A method of manufacturing a semiconductor structure, the method comprising:
    etching a trench in a substrate;
    forming a light-absorption layer in the trench;
    forming a first doped region of a first conductivity type and a second doped region of a second conductivity type in the light-absorption layer adjacent to the first doped region;
    depositing a first patterned mask layer over the light-absorption layer, wherein the first patterned mask layer includes an opening exposing the second doped region and covers the first doped region;
    forming a first silicide layer in the opening on the second doped region;
    depositing a barrier layer over the first doped region; and
    annealing the barrier layer to form a second silicide layer on the first doped region.

2. The method according to claim 1, wherein the light-absorption layer comprises germanium.

3. The method according to claim 1, wherein forming a first silicide layer comprising depositing a metallic material over the first patterned mask layer and within the opening, wherein the first silicide layer is formed in a bottom of the opening.

4. The method according to claim 1, wherein forming a light-absorption layer comprises forming a second patterned mask layer over the substrate and the trench is formed according to the second patterned mask layer.

5. The method according to claim 4, further comprising forming an epitaxial layer on sidewalls and a bottom of the trench prior to forming the light-absorption layer in the trench.

6. The method according to claim 1, further comprising depositing a semiconductor layer over the light-absorption layer, wherein the first doped region and the second doped region are also formed in the semiconductor layer.

7. The method according to claim 1, further comprising depositing a dielectric layer over the first patterned mask layer and exposing the first doped region and the first silicide layer.

8. The method according to claim 7, further comprising depositing a conductive material through the dielectric layer and over the barrier layer to form a first conductive via over the first doped region.

9. The method according to claim 8, wherein a first metal for forming the first silicide layer is different from a second metal for forming the second silicide layer.

10. The method according to claim 1, wherein the first silicide layer comprises a width greater than a width of the second silicide layer.

11. The method according to claim 1, wherein the first doped region laterally surrounds the second doped region from a top-view perspective.

12. The method according to claim 1, wherein the first doped region and the second doped region are configured to form a switch, wherein the second doped region is configured to receive electrons converted from photons received by the light-absorption layer.

13. A method of manufacturing a semiconductor structure, the method comprising:
    forming a light-absorption layer in a substrate;
    forming a first doped region of a first conductivity type and a second doped region of a second conductivity type in the light-absorption layer adjacent to the first doped region;
    forming a patterned mask layer over the light-absorption layer;
    forming a self-aligned silicide layer on the second doped region according to a pattern of the patterned mask layer;
    forming a patterned dielectric layer over the patterned mask layer, the patterned dielectric layer comprising a first via exposing the first doped region; and
    forming a non-self-aligned silicide layer in the first via on the first doped region.

14. The method according to claim 13, further comprising forming a third doped region of the first conductivity type and a fourth doped region of the second conductivity type in the substrate, wherein the first and third doped regions are arranged between the second and fourth doped regions.

15. The method according to claim 13, wherein a first width of the self-aligned silicide layer is greater than a second width of the first via.

16. The method according to claim 13, wherein the self-aligned silicide layer has a first thickness greater than a second thickness of the non-self-aligned silicide layer.

17. A method for manufacturing a semiconductor structure, comprising:
    forming a light-absorption layer in a substrate;
    forming a first doped region of a first conductivity type and a second doped region of a second conductivity type in the light-absorption layer adjacent to the first doped region;
    forming a patterned mask layer comprising a first opening over the light-absorption layer;

depositing a first conductive material in the first opening;

forming a patterning dielectric layer comprising a second opening over the patterned mask layer;

depositing a second conductive material different from the first conductive material in the second opening; and converting the first conductive material and the second conductive material into a first silicide layer and a second silicide layer, respectively, and aligned with the first doped region and the second doped region, respectively.

18. The method of claim 17, wherein the first silicide layer is formed prior to the converting of the second conductive material into the second silicide layer.

19. The method of claim 17, further comprising depositing a first conductive via and a second conductive via over the first silicide layer and the second silicide layer, respectively, wherein the first silicide layer extends beyond a first sidewall of the first conductive via and the second silicide layer is aligned with a second sidewall of the second conductive via.

20. The method of claim 17, further comprising forming a third doped region of the first conductivity type in the light-absorption layer, wherein the first doped region and the third doped region are on two sides of the second doped region.

* * * * *